US012754090B2

(12) United States Patent
Park et al.

(10) Patent No.: US 12,754,090 B2
(45) Date of Patent: Oct. 6, 2026

(54) BAFFLE INSPECTION APPARATUS

(71) Applicant: SAMSUNG ELECTRONICS CO., LTD., Suwon-si (KR)

(72) Inventors: Sangjine Park, Suwon-si (KR); Jihwan Park, Suwon-si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 260 days.

(21) Appl. No.: 18/529,598

(22) Filed: Dec. 5, 2023

(65) Prior Publication Data

US 2024/0192071 A1 Jun. 13, 2024

(30) Foreign Application Priority Data

Dec. 7, 2022 (KR) ........................ 10-2022-0170042

(51) Int. Cl.

*G01L 9/12* (2006.01)
*H10P 72/00* (2026.01)
*H10P 74/00* (2026.01)

(52) U.S. Cl.

CPC ............ *G01L 9/12* (2013.01); *H10P 72/0414* (2026.01); *H10P 72/0424* (2026.01)

(58) Field of Classification Search

CPC .................................................. H10P 72/0414
See application file for complete search history.

(56) References Cited

U.S. PATENT DOCUMENTS 3,323,777 A * 6/1967 Mcmullen ................. B66F 3/18 74/441
3,783,822 A * 1/1974 Wollam .............. H10P 72/7618 118/725
4,280,054 A * 7/1981 Guarino .................. H01J 37/20 250/440.11

(Continued)

FOREIGN PATENT DOCUMENTS

JP 6095993 B2 3/2017
KR 10-1300486 B1 9/2013

(Continued)

OTHER PUBLICATIONS

Office Action dated Jul. 9, 2026, issued by Korean Ministry of Intellectual Property in Korean Patent Application 10-2022-0170042.

*Primary Examiner* — Herbert K Roberts
(74) *Attorney, Agent, or Firm* — Sughrue Mion, PLLC

(57) ABSTRACT

A baffle inspection apparatus is provided and includes: a baffle including a spray surface configured to receive and spray fluid; an upper vessel coupled to the baffle such that the spray surface of the baffle faces downwards; an upper plate above the upper vessel and supporting the upper vessel; a lower vessel below the upper vessel and apart from the upper vessel and the upper plate; a pressure measurement sensor on an upper surface of the lower vessel; a lower plate on a lower surface of the lower vessel and supporting the lower vessel; and a support that supports the upper plate and the lower plate. The upper vessel includes a flow path pipe that is configured to supply the fluid to the baffle so that the fluid is sprayed from the spray surface of the baffle.

20 Claims, 9 Drawing Sheets

(56) References Cited

U.S. PATENT DOCUMENTS 5,010,772 A * 4/1991 Bourland ............... A61B 5/113
73/172
5,092,557 A * 3/1992 Sawatzki .......... H01L 21/67775
414/757
5,262,029 A * 11/1993 Erskine ............... H10P 72/7606
118/503
5,686,989 A * 11/1997 Hoffman ............ G01N 15/0255
356/336
6,086,677 A * 7/2000 Umotoy ............ C23C 16/45565
118/724
6,602,349 B2 * 8/2003 Chandra ............. H10P 72/0441
134/30
6,962,070 B1 * 11/2005 Tanner .................. G01L 5/0052
73/12.07
8,464,594 B2 * 6/2013 Narendrnath ........... G01F 1/663
73/861
9,892,956 B1 * 2/2018 Konkola ........... H01J 37/32009
9,909,648 B2 * 3/2018 Kiser ......................... F16H 1/16
9,911,580 B2 3/2018 Yanai et al.
10,197,333 B2 2/2019 Kim et al.
10,378,107 B2 * 8/2019 Chandrasekharan ........................
C23C 16/45565
2003/0039601 A1 2/2003 Halvorson et al.
2005/0005466 A1 * 1/2005 Kim ......................... G01C 9/00
33/533
2007/0245954 A1 * 10/2007 Collins ............. H01L 21/67051
118/326
2020/0370982 A1 * 11/2020 Won .......................... G01L 1/18
2024/0093940 A1 * 3/2024 Choi ....................... F26B 5/005

FOREIGN PATENT DOCUMENTS

KR 10-1681190 B1 12/2016
KR 10-1994874 B1 7/2019
KR 10-2100011 B1 4/2020
KR 10-2021-0003283 A 1/2021
WO WO-2019226295 A1 * 11/2019 ......... F16M 11/2078

* cited by examiner

BAFFLE INSPECTION APPARATUS

CROSS-REFERENCE TO RELATED APPLICATION

This application is based on and claims priority under 35 U.S.C. § 119 to Korean Patent Application No. 10-2022-0170042, filed on Dec. 7, 2022, in the Korean Intellectual Property Office, the disclosure of which is incorporated by reference herein in its entirety.

BACKGROUND

1. Technical Field

Embodiments of the present disclosure relate to a baffle inspection apparatus.

2. Related Art

As the aspect ratio of semiconductor devices increases, semiconductor devices may be damaged during cleaning and drying processes of a substrate on which the semiconductor devices are formed. In order to reduce damage to semiconductor devices, a supercritical fluid cleaning process is used to clean and dry the semiconductor devices using supercritical carbon dioxide.

SUMMARY

Embodiments of the present disclosure provide a baffle inspection apparatus for inspecting non-uniform spacing and baffle defects that may occur when baffles are coupled.

Problems solved by embodiments of the present disclosure are not limited to the aforementioned problems, and other problems not mentioned will be clearly understood by those skilled in the art from the following description.

According to embodiments of the present disclosure, a baffle inspection apparatus is provided and includes: a baffle including a spray surface configured to receive and spray fluid; an upper vessel coupled to the baffle such that the spray surface of the baffle faces downwards; an upper plate above the upper vessel and supporting the upper vessel; a lower vessel below the upper vessel and apart from the upper vessel and the upper plate; a pressure measurement sensor on an upper surface of the lower vessel; a lower plate on a lower surface of the lower vessel and supporting the lower vessel; and a support that supports the upper plate and the lower plate. The upper vessel includes a flow path pipe that is configured to supply the fluid to the baffle so that the fluid is sprayed from the spray surface of the baffle.

According to embodiments of the present disclosure, a baffle inspection apparatus is provided and includes: a baffle including a spray surface configured to receive and spay fluid; an upper vessel coupled to the baffle such that the spray surface of the baffle faces downward; an upper plate above the upper vessel and supporting the upper vessel; a lower vessel below the upper vessel and apart from the upper vessel and the upper plate; a pressure measurement sensor on an upper surface of the lower vessel; a lower plate on a lower surface of the lower vessel and supporting the lower vessel; a support that supports the upper plate and the lower plate. The upper vessel comprises a flow path pipe that is configured to supply the fluid to the baffle so that the fluid is sprayed from the spray surface of the baffle, and the baffle inspection apparatus further includes: a supply tank connected to the flow path pipe, the supply tank configured to store the fluid and to supply the fluid to the flow path pipe; a pump configured to apply pressure to the fluid and supply the fluid to the supply tank; and a processing unit that includes at least one processor, the processing unit configured to receive result data measured by the pressure measurement sensor, process the result data, and visualize the result data.

According to embodiments of the present disclosure, a baffle inspection apparatus is provided and includes: a baffle including a spray surface configured to receive and spray fluid; an upper vessel including a flow path pipe that is configured to supply the fluid to the baffle so that the fluid is sprayed from the spray surface of the baffle, the upper vessel coupled to the baffle such that the spray surface of the baffle faces downwards; an upper plate above the upper vessel and supporting the upper vessel; a lower vessel below the upper vessel and apart from the upper vessel and the upper plate; a pressure measurement sensor on an upper surface of the lower vessel and configured to measure pressure according to a position of the pressure measurement sensor, the pressure measurement sensor being a capacitance measurement sensor; a lower plate on a lower surface of the lower vessel and supporting the lower vessel; a plurality of leveling screws in the lower plate and configured to adjust a level of the lower vessel to maintain a level of the pressure measurement sensor; a support that supports the upper plate and the lower plate; a supply tank connected to the flow path pipe, the supply tank configured to store the fluid and supply the fluid to the flow path pipe; a pump configured to apply pressure to the fluid and supply the fluid to the supply tank; and a processing unit including at least one processor, the processing unit configured to receive result data measured by the pressure measurement sensor, process the result data, and visualize the result data. The upper vessel includes a baffle hole that is inwardly concaved from a lower surface of the upper vessel, and the baffle includes a baffle coupling surface that is complementarily coupled to the baffle, the baffle coupling surface being on a side of the baffle that is opposite to the spray surface.

BRIEF DESCRIPTION OF DRAWINGS

Embodiments will be more clearly understood from the following detailed description taken in conjunction with the accompanying drawings in which.

DETAILED DESCRIPTION

Figure 1:
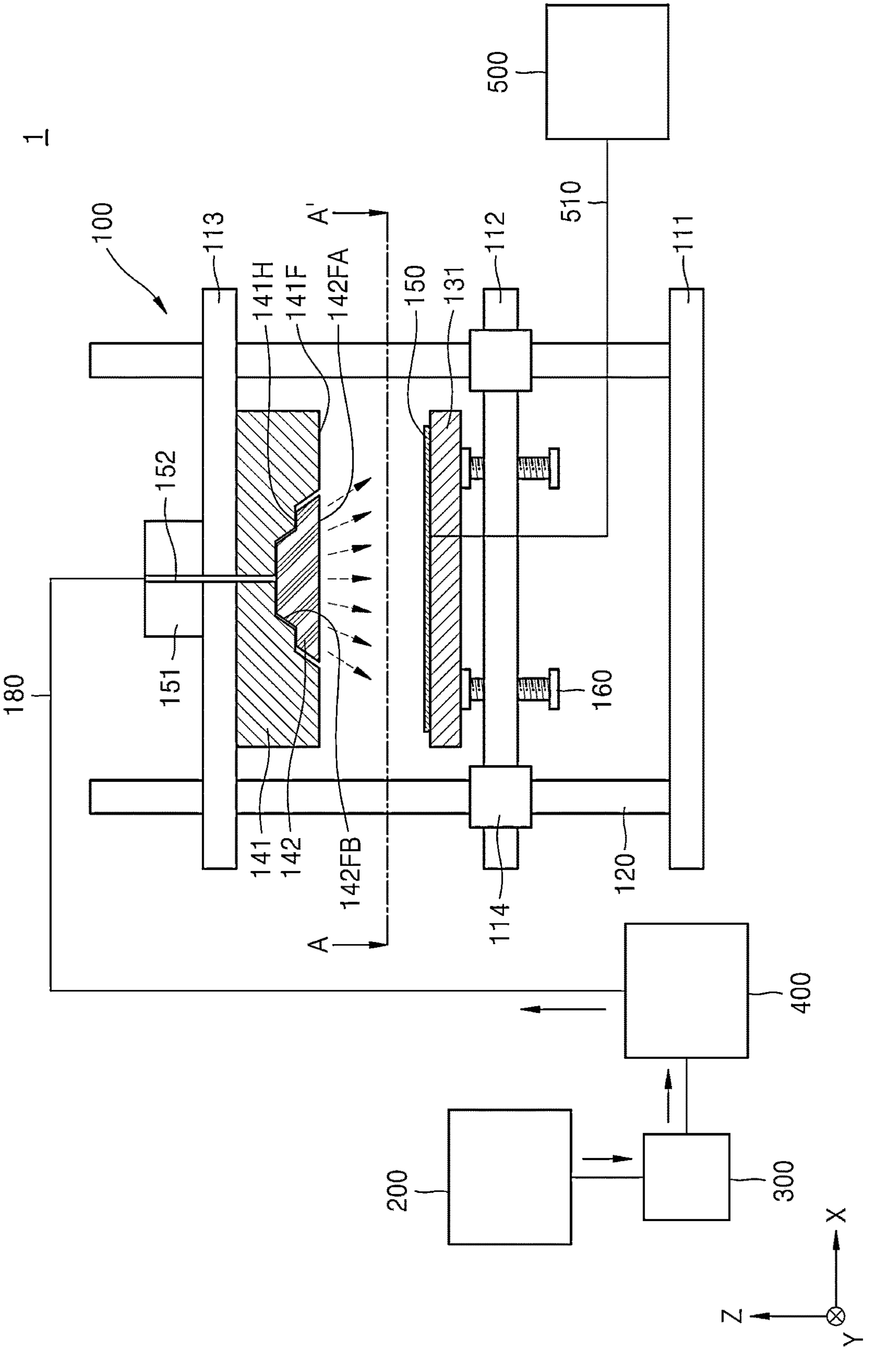
FIG. 1 is a side view illustrating a baffle inspection apparatus according to an embodiment.

Hereinafter, non-limiting example embodiments of the present disclosure are described in detail with reference to the accompanying drawings. The same reference numerals are used for the same components in the drawings, and redundant descriptions thereof are omitted.

It will be understood that when an element is referred to as being "on," "connected to," or "coupled to" another element, it can be directly on, connected to, or coupled to the other element or intervening elements may be present. In contrast, when an element is referred to as being "directly on," "directly connected to," or "directly coupled to" another element, there are no intervening elements present.

Figure 2:
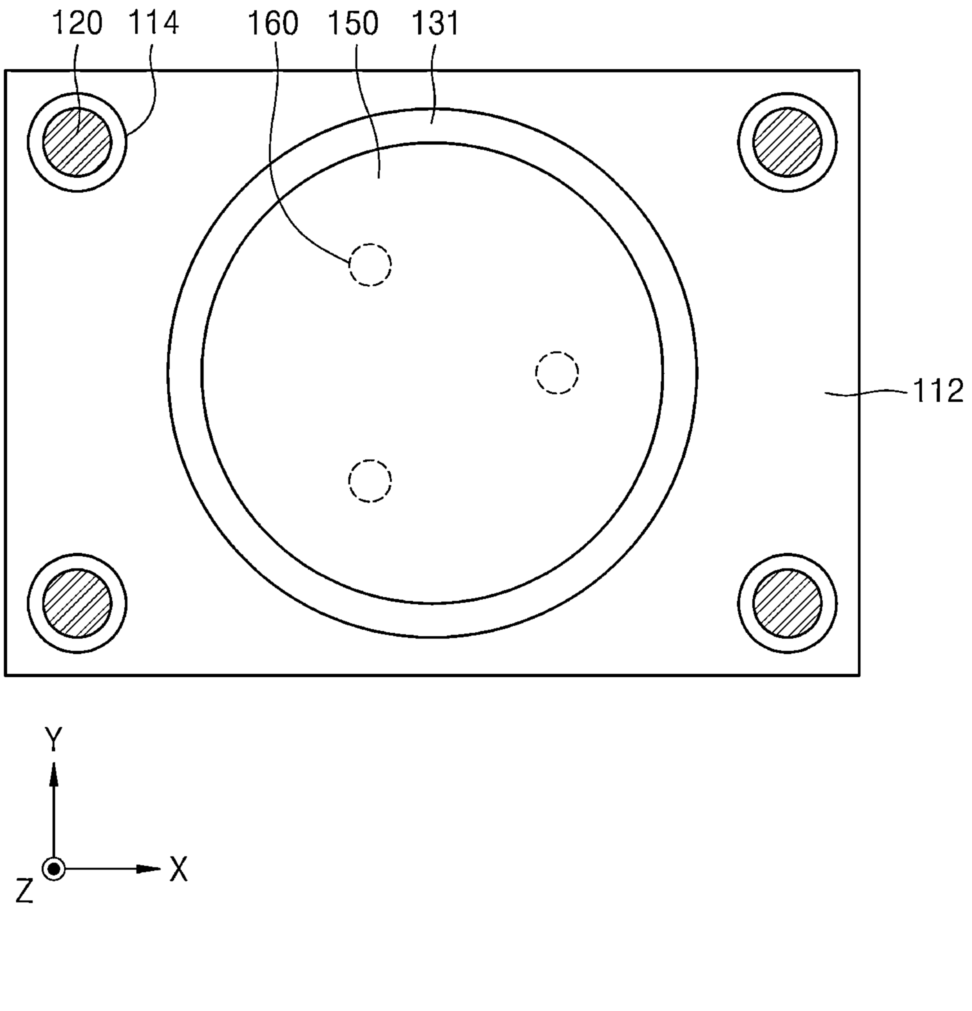
FIG. 2 is a plan view illustrating portion A-A' of the baffle inspection apparatus of FIG. 1 according to an embodiment.

FIG. 1 is a side view illustrating a baffle inspection apparatus 1 according to an embodiment. FIG. 2 is a plan view illustrating portion A-A' of the baffle inspection apparatus of FIG. 1 according to an embodiment.

Referring to FIGS. 1 and 2, the baffle inspection apparatus 1 according to an embodiment may include a baffle inspection unit 100. The baffle inspection unit 100 includes an upper vessel 141, an upper plate 113 supporting the upper vessel 141, a baffle 142 coupled to the upper vessel 141, a lower vessel 131 apart from the baffle 142 and the upper vessel 141 and located below the baffle 142 and the upper vessel 141, a pressure measurement unit 150 (also referred to as a pressure measurement sensor) disposed on an upper surface of the lower vessel 131, a lower plate 112 supporting the lower vessel 131, a plurality of leveling screws 160 supporting the lower vessel 131 from the lower plate 112 and leveling the lower vessel 131, a support 120 fixing and supporting the upper plate 113 and the lower plate 112, a support plate 111 fixing the support 120 and supporting a load applied to the support 120, an upper cap 151 located on the upper plate 113 and a flow path pipe 152 passing through the upper cap 151 and the upper plate 113 to supply fluid to the baffle 142.

The baffle 142 may spray fluid supplied through the flow path pipe 152, downwardly from a spray surface 142FA, which is a lower surface of the baffle 142. The baffle 142 may be part of a configuration of a fluid spray device in a separate substrate treating device. As an embodiment, the baffle 142 may be part of a configuration of a device that sprays a cleaning fluid in a cleaning device using a supercritical fluid. For example, the baffle 142 may be a component of a device spraying supercritical carbon dioxide ($CO_2$). Supercritical carbon dioxide has a critical point at a pressure of about 73.0 atm and a temperature of about 31.1° C. The use of the baffle 142 is not limited by the present specification.

As an embodiment, the baffle 142 may be a multi-channel baffle. The multi-channel baffle refers to a baffle 142 in which many holes are formed to overlap each other in layers. The baffle 142 may have a coupling surface 142FB opposite to the spray surface 142FA. The coupling surface 142FB may be complementarily coupled to a baffle hole 141H provided in the upper vessel 141.

As an embodiment, the coupling surface 142FB may have a shape including a portion in which a width of the coupling surface 142FB of the baffle 142 decreases in a direction away from the spray surface 142FA of the baffle 142. In other words, the coupling surface 142FB may have a tapered shape in which the width of the coupling surface 142FB decreases in a direction away from the spray surface 142FA.

For example, with reference to FIG. 1, the coupling surface 142FB may have a shape including two portions in which the width of the coupling surface 142FB of the baffle 142 gradually decreases in a direction away from the spray surface 142FA of the baffle 142.

The coupling surface 142FB of the baffle 142 may be complementarily coupled to the baffle hole 141H provided in the upper vessel 141. The shape of the baffle hole 141H provided in the upper vessel 141 may have substantially the same shape as a shape of the coupling surface 142FB of the baffle 142. Therefore, like the shape of the coupling surface 142FB of the baffle 142 described above, the width of the baffle hole 141H may narrow inwardly from the lower surface 141F of the upper vessel 141.

The width of the baffle hole 141H may be reduced inwardly from the lower surface 141F of the upper vessel 141, forming a tapered shape. For example, with reference to FIG. 1, there are two portions in which the width of the baffle hole 141H gradually decreases inwardly of the upper vessel 141 from the lower surface 141F of the upper vessel 141.

The lower surface 141F of the upper vessel 141 may be coplanar with the spray surface 142FA of the baffle 142. In other words, the upper vessel 141 and the baffle 142 may be provided such that a plane extending from the lower surface 141F of the upper vessel 141 is the same as a plane extending from the spray surface 142FA of the baffle 142.

The upper plate 113 may be configured to support the upper vessel 141. The upper plate 113 may be bonded to the upper vessel 141, may be coupled to the upper vessel by screws, or welded to the upper vessel 141. As shown in FIG. 1, the upper surface of the upper vessel 141 may be in close contact with the lower surface of the upper plate 113. Alternatively, in a state in which the upper surface of the upper vessel 141 is apart from the lower surface of the upper plate 113 in a facing manner, the upper plate 113 may support the upper vessel 141 through a separate fastening member.

The upper cap 151 may be located on the upper plate 113. The flow path pipe 152 may pass through the upper cap 151, the upper plate 113, and the upper vessel 141 to supply fluid to the baffle 142. Passing through the upper cap 151, the upper plate 113, and the upper vessel 141, the flow path pipe 152 may supply fluid to the baffle 142. According to an embodiment, a fluid supply line 180 to be described below may be connected to the upper cap 151, and fluid supplied from the fluid supply line 180 may be supplied to the baffle 142 through the flow path pipe 152 that passes through the upper cap 151, the upper plate 113, and the upper vessel 141 and has a straight line shape.

Unlike the configuration shown in FIG. 1, the flow path pipe 152 may have both an inlet and an outlet formed in the upper vessel 141, so that the fluid supply line 180 may supply fluid to the inlet of the flow path pipe 152 provided in the upper vessel 141. Alternatively, the upper cap 151 may not be separately provided, and the fluid supply line 180 may supply fluid to the flow path pipe 152 provided in the upper plate 113. Embodiments of the flow path pipe 152 of the present disclosure are not limited by the aforementioned descriptions.

The fluid supplied to the baffle 142 through the fluid supply line 180 and the flow path pipe 152 may be the same as fluid supplied to the baffle 142 during an actual process. Alternatively, the fluid may be air. Alternatively, the fluid supplied to the baffle 142 through the fluid supply line 180 and the flow path pipe 152 may be one or more of gases, such as nitrogen ($N_2$), oxygen ($O_2$), carbon dioxide ($CO_2$), argon (Ar), neon (Ne), and the like. The type of the fluid may be selected according to a purpose of the baffle inspection apparatus 1 according to an embodiment, and a material of the fluid and a combination of materials are not limited by the example embodiments described above.

The upper plate 113 may be fixed and supported by the support 120. According to an embodiment, with reference to FIG. 2, an X-Y plane of the upper plate 113 and/or the lower plate 112 may be a quadrangular shape. A hole through which the support 120 may pass may be provided on the upper plate 113 and/or the lower plate 112, the support 120 may be located through the hole, and the upper plate 113 and/or the lower plate 112 may be coupled to the support 120 by separate screws, fastening members and/or adhesives. Alternatively, a fastening member 114 (also referred to as a fastener) provided between the support 120 and the lower plate 112, which will be described below, may be provided between the upper plate 113 and the support 120, so that the upper plate 113 may be fixed or moved with respect to the support 120.

The support 120 may be provided singly or in plurality in the baffle inspection apparatus 1 according to an embodiment. As shown in FIGS. 1 and 2, four supports 120 may be provided. The four supports 120 may have a pillar shape extending in a Z-axis direction. The four supports may be configured to be parallel to each other.

The support plate 111 may be connected to a lower end of the support 120 to support the support 120.

The lower vessel 131 may be located below the upper vessel 141. The lower vessel 131 may be located below the upper vessel 141 and may be apart from the lower surface 141F of the upper vessel 141. In other words, the lower vessel 131 may be located below the baffle 142 and may be apart from the spray surface 142FA of the baffle 142.

The pressure measurement unit 150 may be provided on the upper surface of the lower vessel 131. The pressure measurement unit 150 may be referred to as a surface pressure measuring device. The pressure measurement unit 150 is for measuring pressure of fluid, which is sprayed from the baffle 142 located above the pressure measurement unit, applied to the pressure measurement unit 150. According to an embodiment, the area of the pressure measurement unit 150 on the X-Y plane may be substantially equal to the area of the substrate or wafer. Alternatively, a size and shape of the pressure measurement unit 150 on the X-Y plane may be substantially the same as a size and shape of the substrate or wafer. Details of the pressure measurement unit 150 are described below.

There may be a separation between the baffle hole 141H and the baffle 142 when the baffle 142 is coupled to the baffle hole 141H. When the separation between the baffle hole 141H and the baffle 142 does not occur uniformly around the baffle 142 due to eccentricity of the baffle 142, fluid may be unevenly sprayed from the spray surface 142FA of the baffle 142.

A defect may occur during a manufacturing process of the baffle 142 or an error may occur in a porous structure of the baffle 142 in terms of manufacturing. Such an error occurring when the baffle 142 sprays fluid may cause the baffle 142 to unevenly spray fluid.

The baffle inspection apparatus 1 according to an embodiment may measure pressure of the fluid, sprayed from the spray surface 142FA of the baffle 142, applied to the upper surface of the pressure measurement unit 150. According to an embodiment, a position of each of sensing elements 150S (refer to FIG. 3) provided in the pressure measurement unit 150 and pressure data measured by the sensing elements 150S may be acquired through the baffle inspection apparatus 1. Accordingly, pressure applied to the pressure measurement unit 180 according to the position of the fluid sprayed from the baffle 142 may be measured through the pressure measurement unit 150.

In a separate substrate treatment apparatus including baffles, baffle problems, such as non-uniform spacing, baffle defects, and errors may occur in coupling of baffles. In the separate substrate treatment apparatus performing a substrate treatment process, the problem of the baffle may be determined through a process result of the separate substrate treatment apparatus. The process result may be a substrate or a wafer. When a process of separately inspecting the process result is performed to determine the problem of the baffle, costs and process time may increase.

The separate substrate treatment apparatus including a baffle may generally include equipment for measuring an internal pressure. It may be practically impossible for the equipment for measuring the internal pressure to measure the pressure applied by the fluid supplied through the baffle applied to the substrate to be treated in the substrate treatment apparatus according to positions. The equipment for measuring the internal pressure is generally used to measure internal pressure of a chamber of the substrate treatment apparatus. Therefore, even if there is a problem with the baffle, it may be difficult to directly find out the problem with the baffle inside the substrate treatment apparatus. As described above, when the problem of the baffle is determined through the process result, it is a case in which a defect has already occurred in the process result. If a process of separately inspecting the process result is performed to determine the problem of the baffle, costs and process time may increase.

The baffle inspection apparatus 1 according to an embodiment may identify uneven spacing of the baffle 142, defects of the baffle 142, and the like. Positions of the sensing elements 150S included in the pressure measurement unit 150 provided in the baffle inspection apparatus 1 may be matched to pressure values measured by the sensing elements 150S. Accordingly, the pressure of the fluid sprayed from the baffle 142 may be measured according to positions through the pressure measurement unit 150.

Pressure values according to positions may be illustrated to be indicated using a processing unit 500 to be described below. Through this, a position at which the pressure value according to the position of the pressure measurement unit 150 is uniquely greater or smaller than other positions may be identified. Alternatively, a position indicating a value outside a certain range, rather than a positional change of the pressure value within the certain range, may be identified. Through this, it is possible to determine that there are uneven spacing of the baffle 142, defects of the baffles 142, and defects in assembling the baffles 142 with other members.

Accordingly, uneven spacing of the baffle 142 and defects of the baffle 142 may be determined through the pressure value measured by the pressure measurement unit 150. That is, uneven spacing of the baffle 142 and defects of the baffle 142 may not be determined by inspecting a process result which has undergone the substrate treatment process, but may be determined through the baffle inspection apparatus 1, which is a separate apparatus according to an embodiment. Accordingly, processing defects of the baffle 142 may be easily determined through the baffle inspection apparatus 1 according to an embodiment.

The baffle inspection apparatus 1 according to an embodiment may include the processing unit 500. The processing unit 500 may receive data measured by the pressure measurement unit 150 wiredly or wirelessly and process the data. According to an embodiment, the pressure measurement unit 150 and the processing unit 500 may be connected through a data cable 510 so that the processing unit 500 may receive the data.

According to embodiments, the processing unit 500 may be implemented in a computer device, such as a personal computer or server that executes a program. For example, the processing unit 500 may include a memory device, such as read only memory (ROM) and random access memory (RAM), and at least one processor configured to perform certain operations and algorithms, such as a microprocessor, a central processing unit (CPU), a graphics processing unit (GPU), and the like. Also, the processing unit 500 may include a receiver and a transmitter for receiving and transmitting electrical signals. According to embodiments, the memory device (also referred to as memory) may comprise computer instructions that, when executed by the at least one processor, are configured to cause the processing unit 500 to perform its functions.

As described above, the processing unit 500 may arrange the pressure data measured by the pressure measurement unit 150 according to the positions of the sensing elements 150S provided in the pressure measurement unit 150, which is described below. The processing unit 500 may visualize the corresponding measured pressure value according to the position and display the visualized pressure value. For example, the processing unit 500 may visualize (e.g., on a display provided as a part of or separately from the baffle inspection apparatus) a pressure measurement value by displaying a location indicating a high pressure in red and a location indicating a relatively low pressure in blue so that a user may easily recognize the distribution of the pressure measurement value.

The pressure applied to the pressure measurement unit 150 by the fluid sprayed from the baffle 142 may be identified through pressure visualization data according to the position of the pressure measurement unit 150. Through this, it is possible to determine whether there is uneven spacing of the baffle 142 or defects of the baffle 142. Accordingly, it is possible to easily identify whether the baffle 142 is unevenly spaced or the baffle 142 is defective through the baffle inspection apparatus 1 according to an embodiment.

According to an embodiment, the baffle inspection apparatus 1 may further include a storage tank 200 storing fluid, a pump 300 applying pressure to the fluid, and a supply tank 400 supplying the fluid to the baffle 142 through the fluid supply line 180. The storage tank 200, the pump 300, and the supply tank 400 may be connected through the fluid supply line 180. The supply tank 400 may be connected to the flow path pipe 152 through the fluid supply line 180. The pump 300 may apply pressure to the fluid. According to an embodiment, the pump 300 may apply a pressure of about 2 bar or more and about 100 bar or less to the fluid. Therefore, the fluid stored in the supply tank 400 may have the pressure of about 2 bar or more and about 100 bar or less. In an embodiment, the pump 300 may apply a pressure of about 70 bar to the fluid. Accordingly, the fluid stored in the supply tank 400 may have a pressure of about 70 bar.

Figure 3:
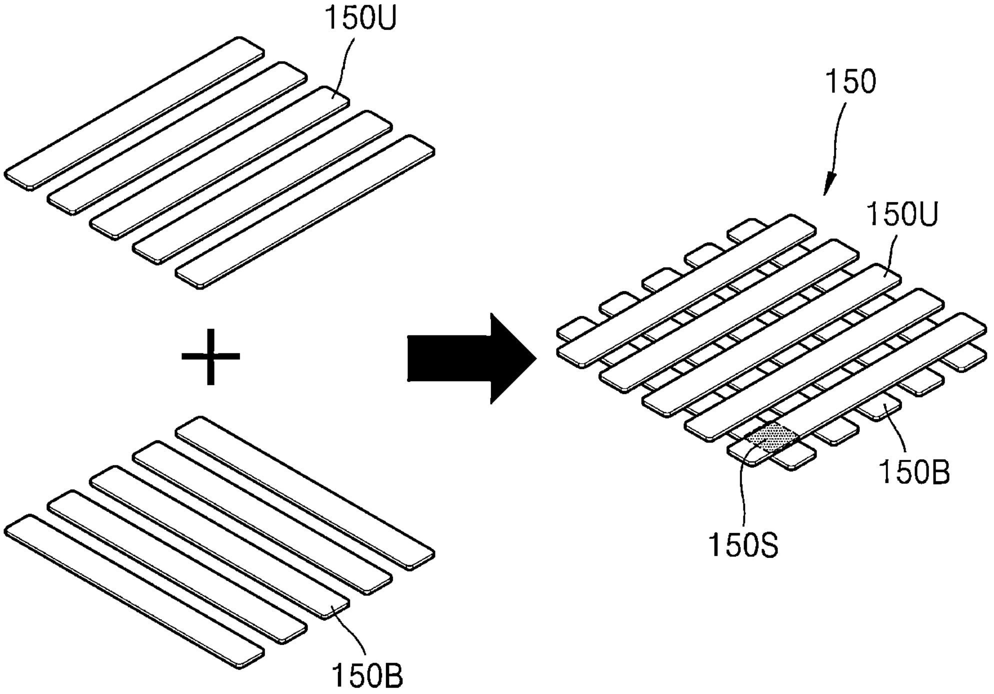
FIG. 3 is a diagram schematically illustrating a configuration of a pressure measurement unit of a baffle inspection apparatus according to an embodiment.

FIG. 3 is a diagram schematically illustrating a configuration of the pressure measurement unit 150 of the baffle inspection apparatus 1 according to an embodiment.

Referring to FIG. 3, the pressure measurement unit 150 of the baffle inspection apparatus 1 according to an embodiment may be configured as a capacitive pressure measurement sensor. An upper electrode array 150U may be disposed to cross a lower electrode array 150B. Capacitance electrical signal data of the sensing elements 150S, in which at least a portion of the upper electrode array 150U crosses at least a portion of the lower electrode array 150B, may be separately identified according to the positions of the sensing elements 150S by the processing unit 500. A capacitance electrical signal may be extracted from a portion of the upper electrode array 150U included in the sensing elements 150S and a portion of the lower electrode array 150B included in the sensing elements 150S, which are separately identified from each other according to positions. The processing unit 500 may receive capacitance electrical signals obtained from the upper electrode array 150U and the lower electrode array 150B with a time difference from each other. The received electrical signal may undergo digital signal conversion in the processing unit 500 and pass through a capacitance analysis circuit provided in the processing unit 500.

Figure 4:
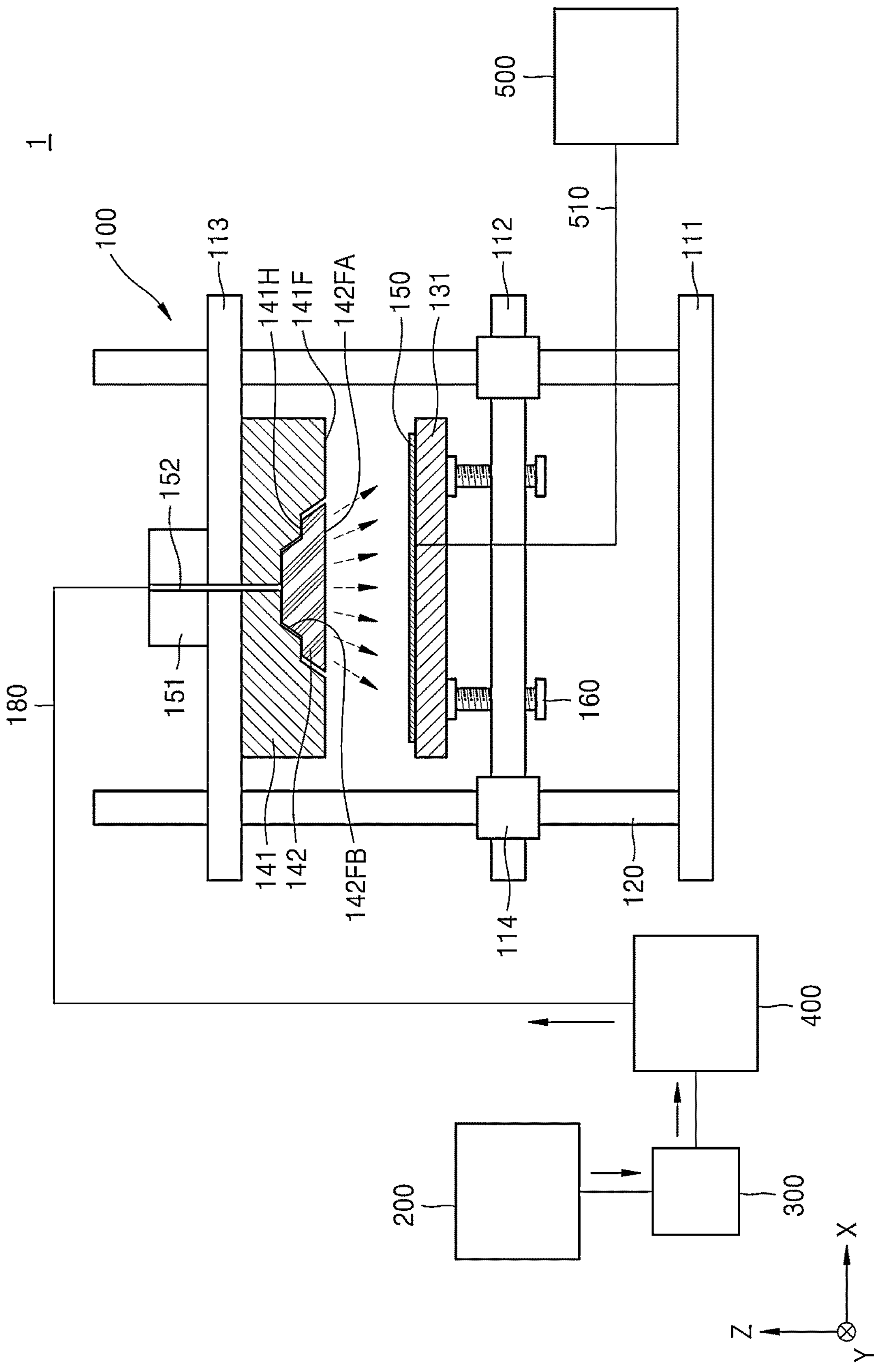
FIG. 4 is a side view illustrating a baffle inspection apparatus according to an embodiment.
Figure 5:
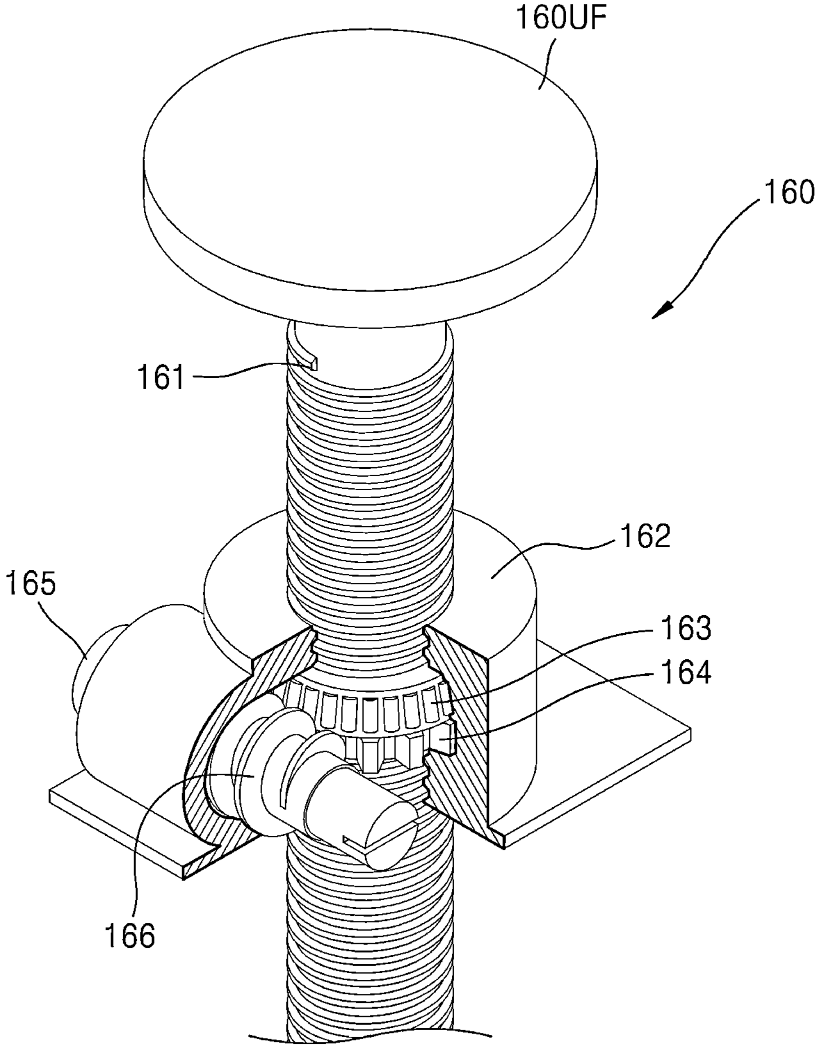
FIG. 5 is an enlarged view illustrating a leveling screw included in a baffle inspection apparatus according to an embodiment.
Figure 6:
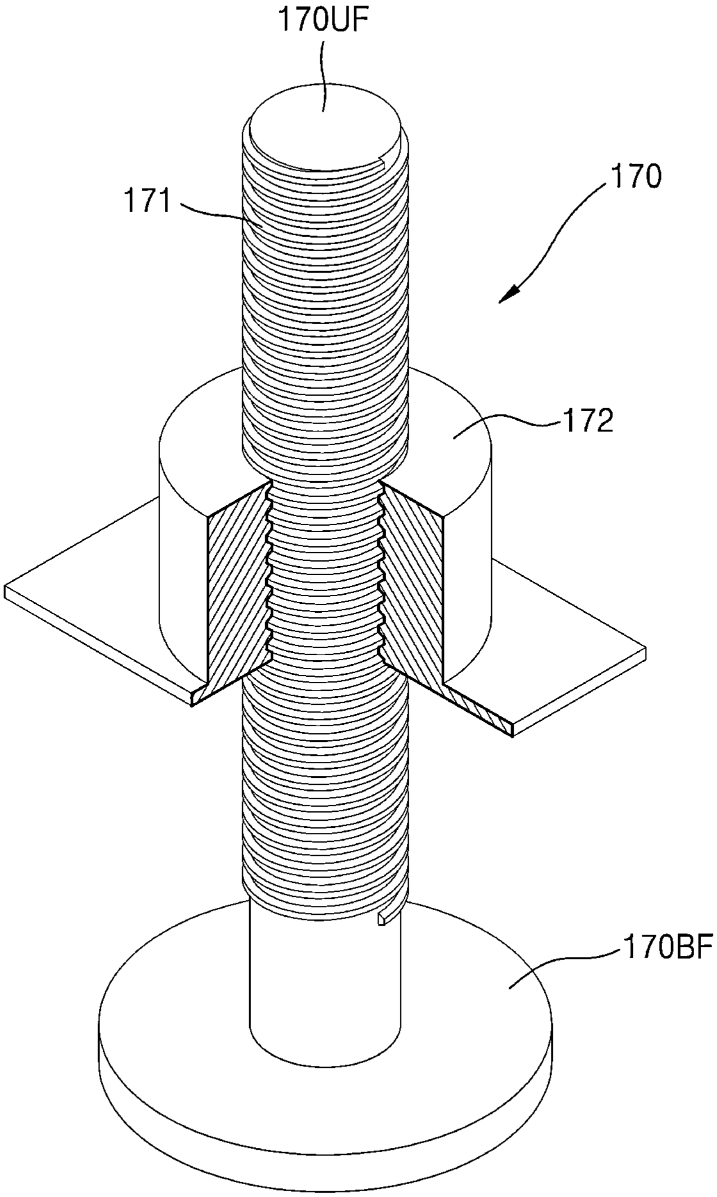
FIG. 6 is an enlarged view illustrating a leveling screw included in a baffle inspection apparatus according to an embodiment.

FIG. 4 is a side view illustrating the baffle inspection apparatus 1 according to an embodiment. FIG. 5 is an enlarged view illustrating the leveling screw 160 included in the baffle inspection apparatus 1 according to an embodiment. FIG. 6 is an enlarged view illustrating a leveling screw 170 included in the baffle inspection apparatus according to an embodiment. Descriptions that are redundant with respect to previous descriptions of the present disclosure may be omitted.

Referring to FIGS. 4 to 6, the pressure measurement unit 150 may be adjusted to be closer to or farther from the spray surface 142FA of the baffle 142 through the leveling screw 160. The pressure measurement unit 150 may be adjusted to be level with respect to the spray surface 142FA of the baffle 142 by the leveling screw 160. Depending on the configuration of the leveling screw 160, the level of the pressure measurement unit 150 may be finely adjusted.

Two or more leveling screws 160 may be provided. As an embodiment, as shown in FIG. 2, three leveling screws 160 supporting the lower vessel 131 may be provided.

The leveling screw 160 may include a screw head 160UF, a screw thread 161 provided around a screw body, a support portion 162 engaged with the screw thread 161, a support bearing 163 embedded in the support portion 162 and provided around the screw body, a spur gear 164 embedded in the support portion 162 and provided around the screw body, and a worm gear 166 engaged with the spur gear 164 and embedded in the support portion 162.

The screw head 160UF may contact the lower surface of the lower vessel 131. A height of the lower vessel 131 may be adjusted according to a height of the screw head 160UF. The height may be adjusted by rotating the worm gear 166. When the screw head 165 provided at one end of the worm gear 166 is rotated, the worm gear 166 may rotate. When the worm gear 166 rotates, the spur gear 164 may rotate by a screw thread provided around the worm gear 166. When the spur gear 164 rotates, the leveling screw 160 may ascend or descend in a vertical direction according to the rotation of the spur gear 164.

Because the leveling screw 160 controls the rotation of the worm gear 166, rather than directly adjusting the rotation of the spur gear 164, the leveling screw 160 is advantageous for fine height adjustment. Therefore, through fine height adjustment of the screw head 160UF of the leveling screw 160, the leveling of the lower vessel 131 and the pressure measurement unit 150 placed on the lower vessel 131 may be easily achieved.

The leveling screw may be the leveling screw 170 as shown in FIG. 6. The leveling screw 170 may have a relatively simple structure, compared to the leveling screw 160 in FIG. 5. The leveling screw 170 in FIG. 6 may include a screw top 170UF, a screw thread 171 formed around a screw body, a support portion 172 complementarily coupled to the screw thread 171 to support a load, and a screw head 170BF located on the opposite side of the screw top 170UF of the leveling screw 170.

When the screw head 170BF is rotated, the leveling screw 170 may ascend or descend in a vertical direction of the screw top 170UF along the screw thread. The leveling screw 170 of FIG. 6 may have a relatively simple configuration, compared to the leveling screw 160 of FIG. 5.

Figure 7:
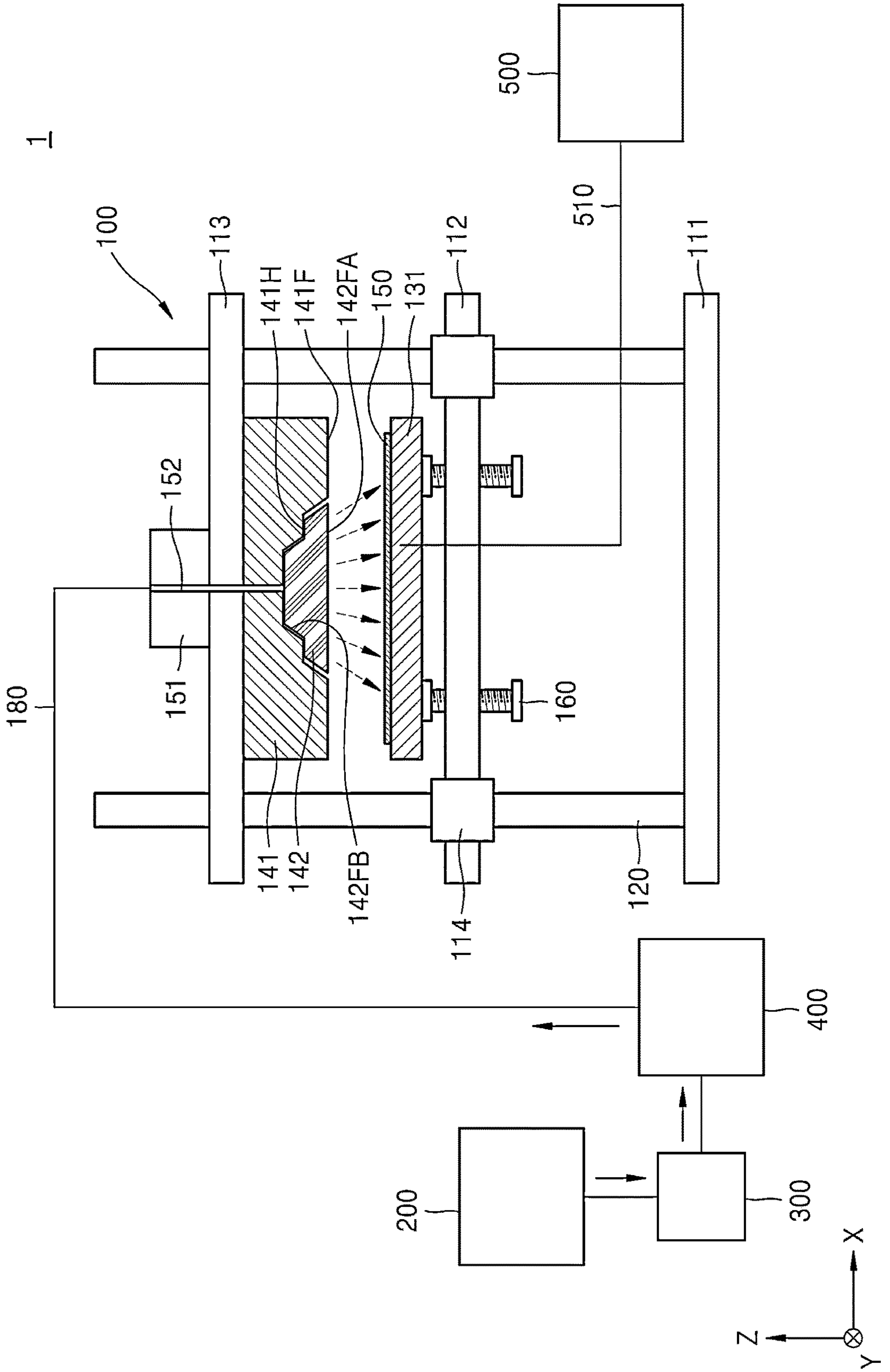
FIG. 7 is a side view illustrating a baffle inspection apparatus according to an embodiment.

FIG. 7 is a side view illustrating the baffle inspection apparatus 1 according to an embodiment. Descriptions that are redundant with respect to previous descriptions of the present disclosure may be omitted.

Referring to FIG. 7, a vertical height of the lower plate 112 relative to the support plate 111 may be adjusted. The fastening member 114 may be located in a portion in which the lower plate 112 contacts the support 120. The support 120 may pass through the fastening member 114, and the fastening member 114 may be coupled to the lower plate 112.

A state of the support 120 may be adjusted between a fastened state and a non-fastened state through the fastening member 114. In a state in which the fastening member 114 is fastened to the support 120, the fastening member 114 is fixed to the support 120 so that the lower plate 112 does not move. In a state in which the fastening member 114 is not fastened to the support 120, the vertical height of the lower plate 112 may be adjusted based on the support plate 111. According to an embodiment, as shown in FIG. 7, the vertical height of the lower plate 112 from the support plate 111 may be adjusted. Although the vertical height of the lower vessel 131 and the pressure measurement unit 150 may be adjusted through the leveling screw 160, adjustment of the vertical height of the lower plate 112 may be performed within a wider range through the fastening member 114 than that of the adjustment of the vertical height through the leveling screw 160. Therefore, when the adjustment of the vertical height within a wider range is required, the vertical height of the lower vessel 131 and the pressure measurement unit 150 may be adjusted through the fastening member 114.

Figure 8:
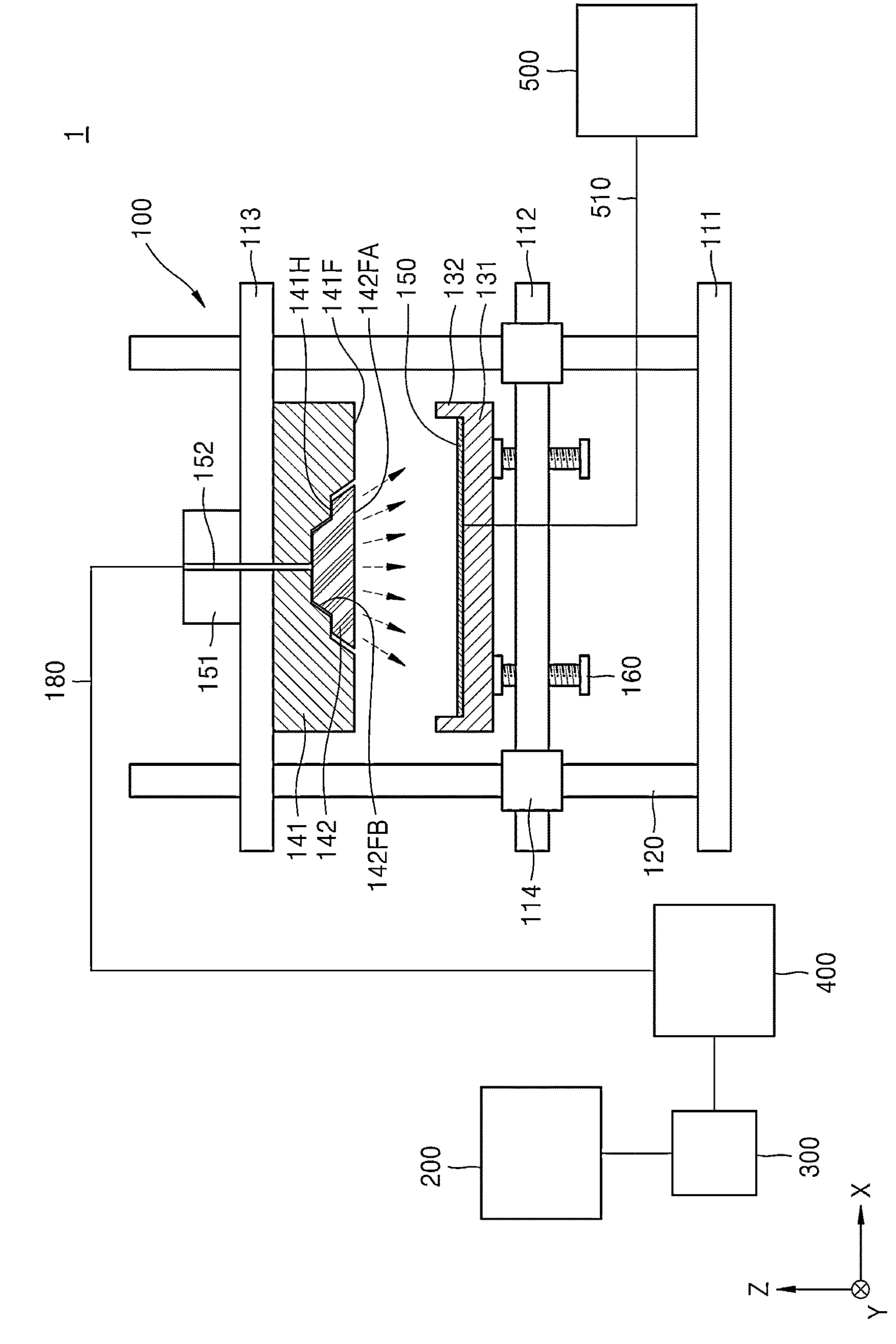
FIG. 8 is a side view illustrating a baffle inspection apparatus according to an embodiment.

FIG. 8 is a side view illustrating the baffle inspection apparatus 1 according to an embodiment. Descriptions that are redundant with respect to previous descriptions of the present disclosure may be omitted.

Referring to FIG. 8, a lower vessel protrusion 132 protruding upwardly from the lower vessel 131 along an outer edge of the lower plate 112 and/or an outer edge of the lower vessel 131 and surrounding the pressure measurement unit 150 may be further provided. To be more similar to an environment used in an actual process, flow of the fluid sprayed through the baffle 142 may be made to be closer to an actual process environment through the lower vessel protrusion 132 located around the pressure measurement unit 150.

Figure 9:
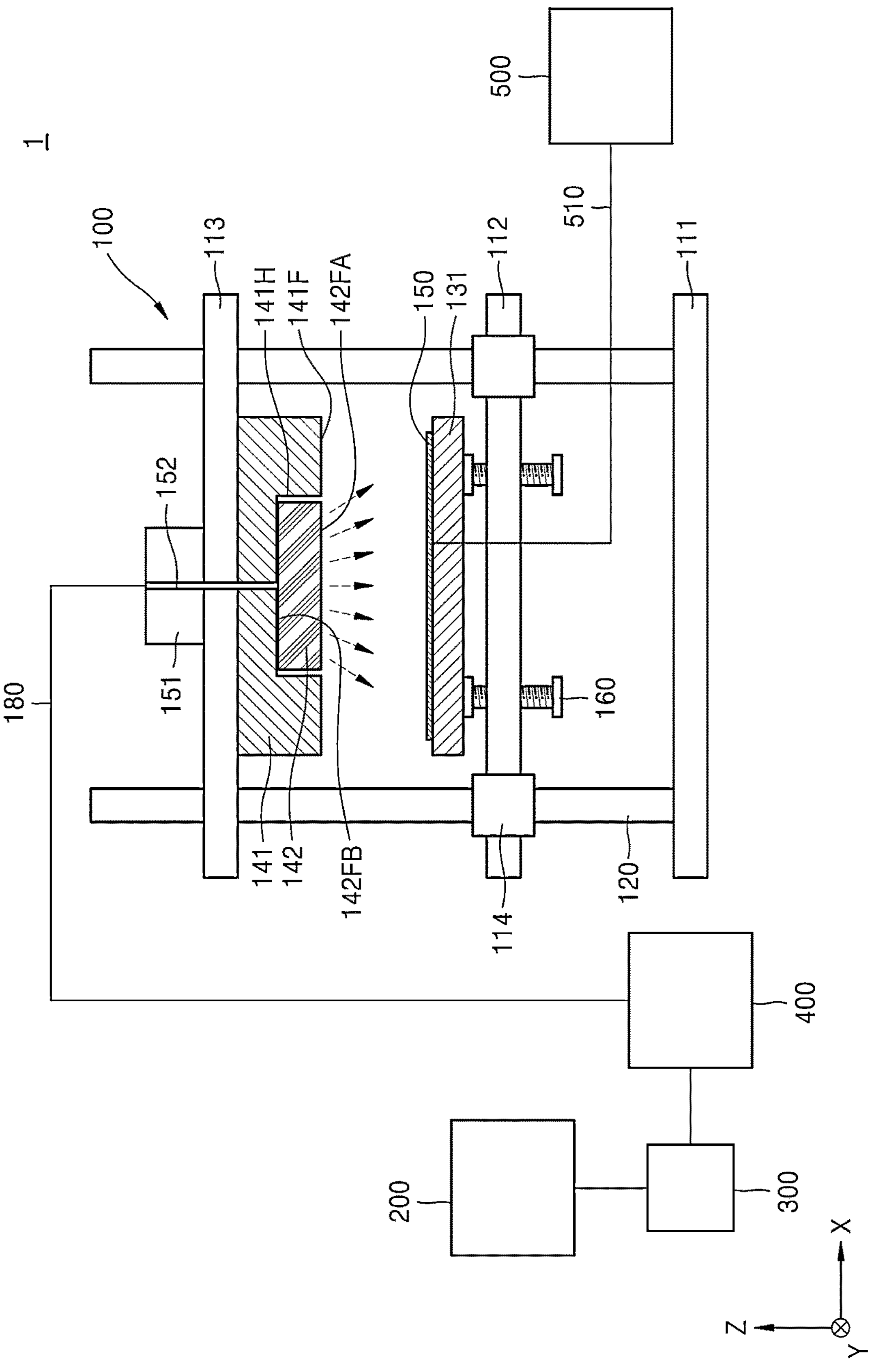
FIG. 9 is a side view illustrating a baffle inspection apparatus according to an embodiment.

FIG. 9 is a side view illustrating the baffle inspection apparatus 1 according to an embodiment. Descriptions that are redundant with respect to previous descriptions of the present disclosure may be omitted.

Referring to FIG. 9, a shape of the baffle 142 may be different from the shape of the baffle described above. The baffle 142 may have the coupling surface 142FB on the opposite side of the spray surface 142FA. The coupling surface 142FB may be complementarily coupled to the baffle hole 141H provided in the upper vessel 141.

As an embodiment, the baffle 142 may have a cylindrical shape. The shape of the baffle hole 141H provided in the upper vessel 141 may have the same shape as the shape of the coupling surface 142FB of the baffle 142. Like the shape of the coupling surface 142FB of the baffle 142 described above, the baffle hole 141H may have a circular shape inwardly recessed from the lower surface 141F of the upper vessel 141 to be complementarily coupled to the baffle 142 having a cylindrical shape.

While non-limiting example embodiments have been particularly shown and described in the present disclosure, it will be understood that various changes in form and details may be made therein without departing from the spirit and scope of the present disclosure.

What is claimed is:

1. A baffle inspection apparatus comprising:

a baffle comprising a spray surface configured to receive and spray fluid;

an upper vessel coupled to the baffle such that the spray surface of the baffle faces downwards;

an upper plate above the upper vessel and supporting the upper vessel;

a lower vessel below the upper vessel and apart from the upper vessel and the upper plate;

a pressure measurement sensor on an upper surface of the lower vessel;

a lower plate on a lower surface of the lower vessel and supporting the lower vessel; and a support that supports the upper plate and the lower plate, wherein the upper vessel comprises a flow path pipe that is configured to supply the fluid to the baffle so that the fluid is sprayed from the spray surface of the baffle, and wherein the lower plate is movably connected to a vertically extending portion of the support, and the vertically extending portion of the support extends vertically past the lower plate and is connected to the upper plate.

2. The baffle inspection apparatus of claim 1, wherein the lower plate is configured to move, relative to the support, towards or away from the upper plate while the lower plate supports the lower vessel.

3. The baffle inspection apparatus of claim 1, further comprising:

a supply tank connected to the flow path pipe, the supply tank configured to store the fluid and supply the fluid to the flow path pipe; and a pump configured to apply pressure to the fluid and supply the fluid to the supply tank.

4. The baffle inspection apparatus of claim 3, further comprising a processing unit comprising at least one processor, the processing unit configured to receive result data measured by the pressure measurement sensor, process the result data, and visualize the result data.

5. The baffle inspection apparatus of claim 1, wherein the upper vessel comprises a baffle hole that is inwardly concaved from a lower surface of the upper vessel, and wherein the baffle hole is complementarily coupled to a baffle coupling surface of the baffle, the baffle coupling surface being on a side of the baffle that is opposite to the spray surface.

6. The baffle inspection apparatus of claim 5, wherein the baffle is coupled to the upper vessel such that the spray surface of the baffle is coplanar with the lower surface of the upper vessel.

7. The baffle inspection apparatus of claim 5, wherein the baffle comprises a tapered portion in which a width of the baffle decreases in an upward direction from the spray surface, and wherein the tapered portion is in contact with the upper vessel.

8. The baffle inspection apparatus of claim 1, wherein the pressure measurement sensor is configured as a capacitance measurement sensor.

9. The baffle inspection apparatus of claim 8, wherein the pressure measurement sensor comprises an upper electrode array and a lower electrode array that cross each such as to form a plurality of sensing elements, and wherein the pressure measurement sensor is configured to measure pressure of the fluid sprayed from the baffle based on a position of each of the plurality of sensing elements and data measured from the plurality of sensing elements.

10. The baffle inspection apparatus of claim 9, further comprising a processing unit configured to receive the data measured by the pressure measurement sensor, process the data, and obtain pressure values according to positions of the plurality of sensing elements.

11. The baffle inspection apparatus of claim 1, further comprising a lower vessel protrusion protruding from the upper surface of the lower vessel, on which the pressure measurement sensor is provided, along an outer edge of the lower vessel.

12. The baffle inspection apparatus of claim 1, further comprising:

a plurality of leveling screws in the lower plate, the plurality of leveling screws configured to adjust a level of the lower vessel to maintain a level of the pressure measurement sensor, wherein the plurality of leveling screws each contact the lower surface of the lower vessel, and are configured to adjust a height of each of the plurality of leveling screws with respect to the lower plate.

13. The baffle inspection apparatus of claim 12, wherein the plurality of leveling screws are configured to be rotated with respect to the lower plate such that the height of each of the plurality of leveling screws is adjusted with respect to the lower plate.

14. The baffle inspection apparatus of claim 12, wherein each leveling screw from among the plurality of leveling screws is respectively provided with:

a support bearing supporting a load and coaxially provided with the leveling screw;

a spur gear coaxially provided with the leveling screw; and a worm gear comprising a side surface that is engaged with the spur gear, and wherein each of the plurality of leveling screws is configured to be adjusted in height by ascending or descending due to the spur gear rotating according to rotation of the worm gear.

15. The baffle inspection apparatus of claim 3, wherein the pump is configured to adjust pressure of the fluid stored in the supply tank to be 2 bar or more and 100 bar or less.

16. A baffle inspection apparatus comprising:

a baffle comprising a spray surface configured to receive and spray fluid;

an upper vessel coupled to the baffle such that the spray surface of the baffle faces downward;

an upper plate above the upper vessel and supporting the upper vessel;

a lower vessel below the upper vessel and apart from the upper vessel and the upper plate;

a pressure measurement sensor on an upper surface of the lower vessel;

a lower plate on a lower surface of the lower vessel and supporting the lower vessel;

a support that supports the upper plate and the lower plate, wherein the upper vessel comprises a flow path pipe that is configured to supply the fluid to the baffle so that the fluid is sprayed from the spray surface of the baffle, wherein the baffle inspection apparatus further comprises:

a supply tank connected to the flow path pipe, the supply tank configured to store the fluid and to supply the fluid to the flow path pipe;

a pump configured to apply pressure to the fluid and supply the fluid to the supply tank; and a processing unit that comprises at least one processor, the processing unit configured to receive result data measured by the pressure measurement sensor, process the result data, and visualize the result data, and wherein the lower plate is movably connected to a vertically extending portion of the support, and the vertically extending portion of the support extends vertically past the lower plate and is connected to the upper plate.

17. The baffle inspection apparatus of claim 16, wherein the upper vessel comprises a baffle hole that is inwardly concaved from a lower surface of the upper vessel, and the baffle hole has a width that decreases in an upward direction, and wherein the baffle comprises a baffle coupling surface that is complementarily coupled to the baffle hole, the baffle coupling surface being on a side of the baffle that is opposite to the spray surface.

18. The baffle inspection apparatus of claim 17, further comprising:

a plurality of leveling screws in the lower plate, the plurality of leveling screws configured to adjust a level of the lower vessel to maintain a level of the pressure measurement sensor, wherein the plurality of leveling screws each contact the lower surface of the lower vessel, and each leveling screw from among the plurality of leveling screws is respectively provided with:

a spur gear coaxially provided with the leveling screw;

a support bearing supporting a load and coaxially provided with the leveling screw; and a worm gear comprising a side surface that is engaged with the spur gear, and wherein each of the plurality of leveling screws is configured to be adjusted in height by ascending or descending due to the spur gear rotating according to rotation of the worm gear.

19. A baffle inspection apparatus comprising:

a baffle comprising a spray surface configured to receive and spray fluid;

an upper vessel comprising a flow path pipe that is configured to supply the fluid to the baffle so that the fluid is sprayed from the spray surface of the baffle, the upper vessel coupled to the baffle such that the spray surface of the baffle faces downwards;

an upper plate above the upper vessel and supporting the upper vessel;

a lower vessel below the upper vessel and apart from the upper vessel and the upper plate;

a pressure measurement sensor on an upper surface of the lower vessel and configured to measure pressure according to a position of the pressure measurement sensor, the pressure measurement sensor being a capacitance measurement sensor;

a lower plate on a lower surface of the lower vessel and supporting the lower vessel;

a plurality of leveling screws in the lower plate and configured to adjust a level of the lower vessel to maintain a level of the pressure measurement sensor;

a support that supports the upper plate and the lower plate;

a supply tank connected to the flow path pipe, the supply tank configured to store the fluid and supply the fluid to the flow path pipe;

a pump configured to apply pressure to the fluid and supply the fluid to the supply tank; and a processing unit comprising at least one processor, the processing unit configured to receive result data measured by the pressure measurement sensor, process the result data, and visualize the result data, wherein the upper vessel comprises a baffle hole that is inwardly concaved from a lower surface of the upper vessel, wherein the baffle comprises a baffle coupling surface that is complementarily coupled to the baffle hole, the baffle coupling surface being on a side of the baffle that is opposite to the spray surface, and wherein the lower plate is movably connected to a vertically extending portion of the support, and the vertically extending portion of the support extends vertically past the lower plate and is connected to the upper plate.

20. The baffle inspection apparatus of claim 19, wherein the baffle is coupled to the upper vessel such that the spray surface of the baffle is coplanar with the lower surface of the upper vessel, wherein each leveling screw from among the plurality of leveling screws is respectively provided with:

a support bearing supporting a load and coaxially provided with the leveling screw;

a spur gear coaxially provided with the leveling screw; and a worm gear comprising a side surface that is engaged with the spur gear, and wherein each of the plurality of leveling screws is configured to be adjusted in height by ascending or descending due to the spur gear rotating according to rotation of the worm gear.

* * * * *